US012794494B2

(12) United States Patent
Han et al.

(10) Patent No.: US 12,794,494 B2
(45) Date of Patent: Nov. 10, 2026

(54) ELECTRONIC DEVICE INCLUDING PRINTED CIRCUIT BOARD

(71) Applicant: SAMSUNG ELECTRONICS CO., LTD., Suwon-si (KR)

(72) Inventors: Janghoon Han, Suwon-si (KR); Gilyong Ku, Suwon-si (KR); Hyunjun Kim, Suwon-si (KR); Seongyong Park, Suwon-si (KR); Seunghee Son, Suwon-si (KR); Jiyeong Yu, Suwon-si (KR); Jungeun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 111 days.

(21) Appl. No.: 18/813,495

(22) Filed: Aug. 23, 2024

(65) Prior Publication Data

US 2025/0070803 A1 Feb. 27, 2025

Related U.S. Application Data

(63) Continuation of application No. PCT/KR2024/012650, filed on Aug. 23, 2024.

(30) Foreign Application Priority Data

Aug. 24, 2023 (KR) ........................ 10-2023-0111348
Oct. 18, 2023 (KR) ........................ 10-2023-0139887

(51) Int. Cl.
*H05K 7/00* (2006.01)
*H01Q 1/24* (2006.01)
(Continued)

(52) U.S. Cl.
CPC ........... *H04B 1/0053* (2013.01); *H01Q 1/243* (2013.01); *H05K 7/1427* (2013.01)

(58) Field of Classification Search
CPC .... H04B 1/0053; H01Q 1/243; H05K 7/1427; G06F 1/16
See application file for complete search history.

(56) References Cited

U.S. PATENT DOCUMENTS 10,431,872 B1 * 10/2019 Kim ........................ H01Q 21/28
12,047,522 B2 * 7/2024 Kim .................... H04M 1/0249
(Continued)

FOREIGN PATENT DOCUMENTS

KR 20-0464997 1/2013
KR 10-2017-0037464 A 4/2017
(Continued)

OTHER PUBLICATIONS

International Search Report and Written Opinion issued Nov. 22, 2024 by the International Searching Authority in International Patent Application No. PCT/KR2024/012650 (PCT/ISA/210 and PCT/ISA/237).

*Primary Examiner* — Imani N Hayman
*Assistant Examiner* — Rashen E Morrison
(74) *Attorney, Agent, or Firm* — Sughrue Mion, PLLC

(57) ABSTRACT

An electronic device includes a housing including at least one conductive portion disposed along at least a portion of a side surface of the housing, the at least one conductive portion configured to receive or to transmit a signal, a first module inside the housing and adjacent to the at least one conductive portion, and a first printed circuit board inside the housing and comprising a communication line electrically connected to the first module, wherein the communication line extends along an edge of the first printed circuit board to have a resonance frequency different from a frequency of the signal received or transmitted by the at least one conductive portion.

13 Claims, 9 Drawing Sheets

(51) Int. Cl.
*H04B 1/00* (2006.01)
*H05K 7/14* (2006.01)

(56) References Cited

U.S. PATENT DOCUMENTS

| | | | |
|---|---|---|---|
| 2015/0087362 | A1 | 3/2015 | Dokai et al. |
| 2016/0088130 | A1 | 3/2016 | Jung et al. |
| 2016/0255733 | A1* | 9/2016 | Jung ..................... G06F 1/1633 361/759 |
| 2017/0214132 | A1* | 7/2017 | Jeon ................... G06Q 20/3278 |
| 2018/0287246 | A1 | 10/2018 | Kim et al. |
| 2019/0252766 | A1 | 8/2019 | Jeon et al. |
| 2020/0163201 | A1 | 5/2020 | Akashi et al. |
| 2020/0381830 | A1 | 12/2020 | Kim et al. |
| 2021/0181691 | A1* | 6/2021 | Rothkopf ................ G06F 3/015 |
| 2022/0224003 | A1 | 7/2022 | Kwak et al. |
| 2023/0231322 | A1* | 7/2023 | Jung ........................ H01Q 1/38 343/702 |

FOREIGN PATENT DOCUMENTS

| | | | |
|---|---|---|---|
| KR | 10-2019-0090441 | A | 8/2019 |
| KR | 10-2019-0098527 | A | 8/2019 |
| KR | 10-2129799 | B1 | 7/2020 |
| KR | 10-2022-0102503 | A | 7/2022 |
| KR | 10-2022-0139617 | A | 10/2022 |
| KR | 10-2023-0053244 | A | 4/2023 |
| WO | 2020/176167 | A1 | 9/2020 |

* cited by examiner

ELECTRONIC DEVICE INCLUDING PRINTED CIRCUIT BOARD

CROSS-REFERENCE TO RELATED APPLICATIONS

This application is continuation of International Application No. PCT/KR2024/012650 designating the United States, filed on Aug. 23, 2024, in the Korean Intellectual Property Receiving Office and claiming priority to Korean Patent Application Nos. 10-2023-0111348, filed on Aug. 24, 2023, and 10-2023-0139887, filed on Oct. 18, 2023, in the Korean Intellectual Property Office, the disclosures of each of which are incorporated by reference herein in their entireties.

BACKGROUND

1. Field

The disclosure relates to an electronic device including a printed circuit board.

2. Description of Related Art

The remarkable development of information and communication technology and semiconductor technology has rapidly increased the proliferation and use of various electronic devices. Electronic devices have been developed in recent years so that communication may be performed while the electronic devices are being carried.

An electronic device may refer to a device that executes a specific function according to a loaded program, such as a home appliance, an electronic notebook, a portable multimedia player, a mobile communication terminal, a tablet PC, a video/audio device, a desktop/laptop computer, or a vehicle navigation device. For example, these electronic devices may output stored information as sound or an image. As the integration level of electronic devices increases and high-speed, large-capacity wireless communication becomes more common, a single electronic device such as a mobile communication terminal may be equipped with a various functions. For example, an entertainment function such as games, a multimedia function such as music/video playback, a communication and security function for mobile banking, and a function such as schedule management or an electronic wallet in addition to a communication function are integrated into a single electronic device. These electronic devices are being miniaturized so that users may conveniently carry them.

SUMMARY

According to an aspect of the disclosure, an electronic device includes a housing including at least one conductive portion disposed along at least a portion of a side surface of the housing, the at least one conductive portion configured to receive or to transmit a signal, a first module inside the housing and adjacent to the at least one conductive portion, and a first printed circuit board inside the housing and comprising a communication line electrically connected to the first module, wherein the communication line extends along an edge of the first printed circuit board to have a resonance frequency different from a frequency of the signal received or transmitted by the at least one conductive portion.

The communication line may comprise a first communication line disposed along an edge of the first printed circuit board and connected to the first module, and a second communication line electrically connected to the first communication line.

The communication line may comprise a first communication line and a second communication line connected to a stub in parallel.

The first communication line and the second communication line may extend in a loop shape from the stub.

The electronic device may further include a second printed circuit board electrically connected to the first printed circuit board. The electronic device may further include at least one processor disposed on the second printed circuit board and electrically connected to the communication line.

A first end of the second communication line may be connected to the first communication line through the stub, and a second end of the second communication line, different from the first end, may be connected to a switch.

The second communication line may be configured to be switchable, via the switch, to a first state in which the second end is open or to a second state in which the second end is electrically connected to a ground.

The first communication line may be a low-speed communication line.

The resonance frequency of the communication line may be 700 MHz or less, or 1.0 GHz or more and 1.8 GHz or less.

The first module may be a camera adjacent to the at least one conductive portion.

The first module may be a sensor adjacent to the at least one conductive portion.

The at least one conductive portion may be configured to operate as an antenna radiator.

As the first communication line having a first length and the second communication line having a second length are connected in parallel, a total length of the communication line may be a sum of the first length and the second length.

The communication line may extend in a loop shape along the edge of the first printed circuit board.

The first communication line may be a I2C (inter integrated circuit) communication line.

The stub may be an open stub or a short stub.

The first communication line and the second communication line may extend from the stub along the edge of the first printed circuit board.

The first communication line may be connected to the first module through the stub.

A first end of the second communication line may be connected to the first communication line through the stub.

A second end of the second communication line, different from the first end, may be connected to a ground.

A second end of the second communication line, different from the first end, may be open.

According to another aspect of the disclosure, an electronic device includes a housing including at least one conductive portion segmented along at least a portion of a side surface of the housing, a first module inside the housing and being adjacent to the at least one conductive portion, a first printed circuit board inside the housing and electrically connected to the first module, and a communication line including a first communication line along an edge of the first printed circuit board and connected to the first module, and a second communication line connected in parallel with the first communication line. The at least one conductive portion may be configured to receive a signal of a first frequency, and the communication line may be configured to resonate at a second frequency different from the first frequency.

The first communication line and the second communication line may be in a loop shape through a stub.

The electronic device may further include a second printed circuit board electrically connected to the first printed circuit board. The communication line on the first printed circuit board may be electrically connected to at least one processor on the second printed circuit board.

A first end of the second communication line may be connected to the first communication line through the stub, and a second end of the second communication line, different from the first end, may be connected to a switch.

The second communication line may be configured to be switchable, via the switch, to a first state in which the second end is open or to a second state in which the second end is electrically connected to a ground.

The first communication line may be a low-speed communication line.

The second frequency may be 700 MHz or less, or 1.0 GHz or more and 1.8 GHz or less.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
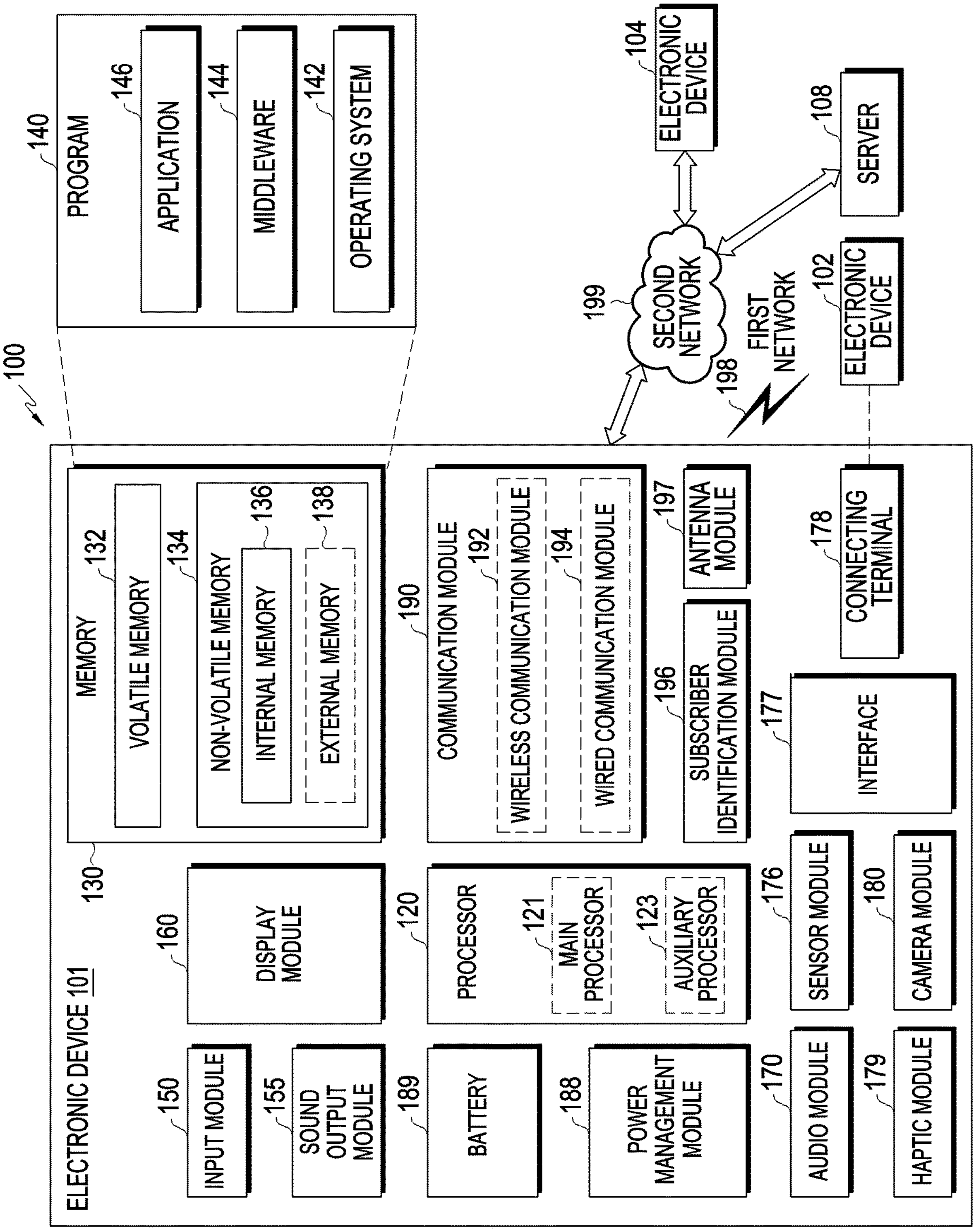
FIG. 1 is a block diagram illustrating an electronic device in a network environment according to some embodiments of the disclosure.

Hereinafter, example embodiments of the disclosure will be described in detail with reference to the accompanying drawings.

The terms used herein will be briefly described, and the disclosure will be described in detail.

The terms used herein are general terms currently widely used in the art in consideration of functions in the disclosure, but the terms may vary according to the intention of one of ordinary skill in the art, precedents, or new technology in the art. Also, some of the terms used herein may be arbitrarily chosen by the present applicant, and in this case, these terms are defined in detail below. Accordingly, the specific terms used herein should be defined based on the unique meanings thereof and the whole context of the disclosure.

It will be understood that when a certain part "includes" a certain component, the part does not exclude another component but may further include another component, unless the context clearly dictates otherwise.

It will be understood that although the terms "first," "second," etc. may be used herein to describe various components, these components should not be limited by these terms. These terms are only used to distinguish one component from another.

The disclosure will now be described more fully with reference to the accompanying drawings for one of ordinary skill in the art to be able to perform the disclosure without any difficulty. However, the disclosure may be embodied in many different forms and is not limited to the embodiments set forth herein. For clarity, portions irrelevant to the descriptions of the disclosure are omitted in the drawings, and like components are denoted by like reference numerals throughout the specification.

The terms "upper side", "lower side", and "front-back direction" used herein are defined based on the drawings, and a shape and a position of each element are not limited by these terms.

Hereinafter, embodiments of the disclosure will be described in detail with reference to the accompanying drawings.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to some embodiments, another component (e.g., a radio frequency integrated circuit (RFIC)) other than the radiating element may be additionally formed as part of the antenna module 197.

According to an embodiment, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with an embodiment of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Embodiments of the disclosure may be implemented as software (e.g., a program) including one or more instructions that are stored in a storage medium (e.g., internal memory or external memory) that is readable by a machine (e.g., an electronic device). For example, a processor (e.g., a processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
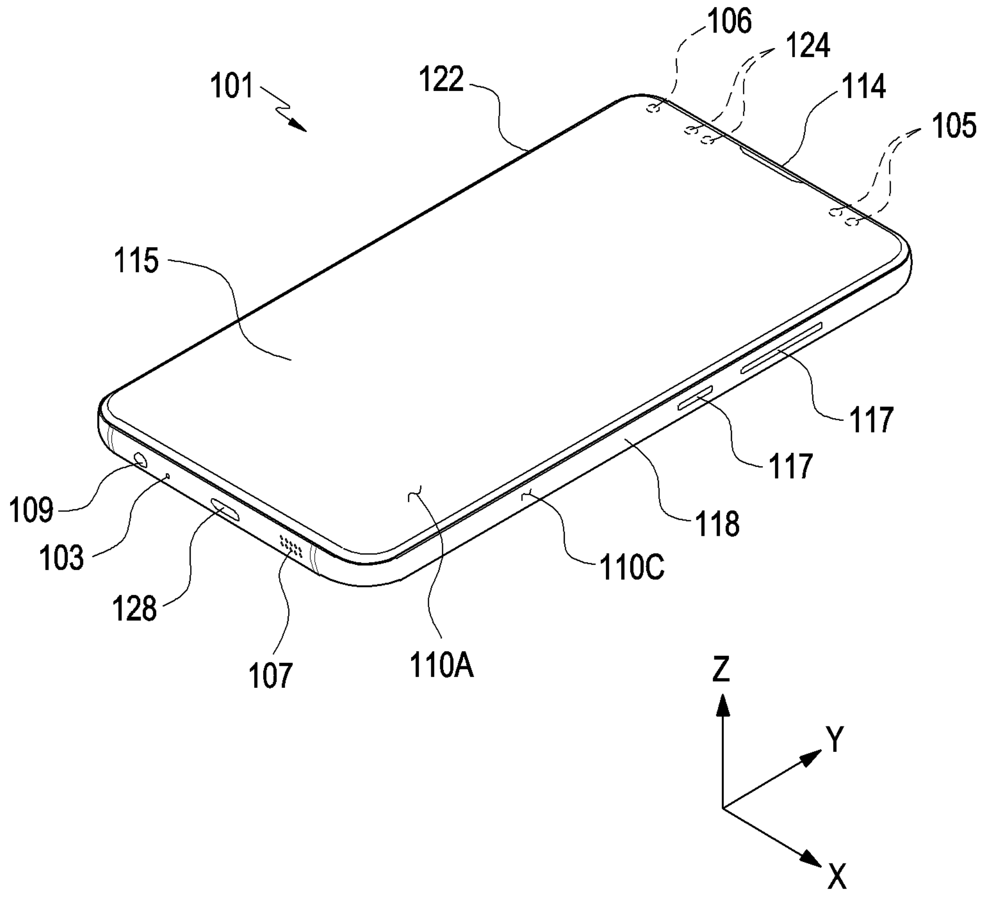
FIG. 2 is a perspective view illustrating a front surface of an electronic device according to some embodiments of the disclosure.

FIG. 2 is a perspective view illustrating a front surface of the electronic device 101 according to some embodiments of the disclosure.

Figure 3:
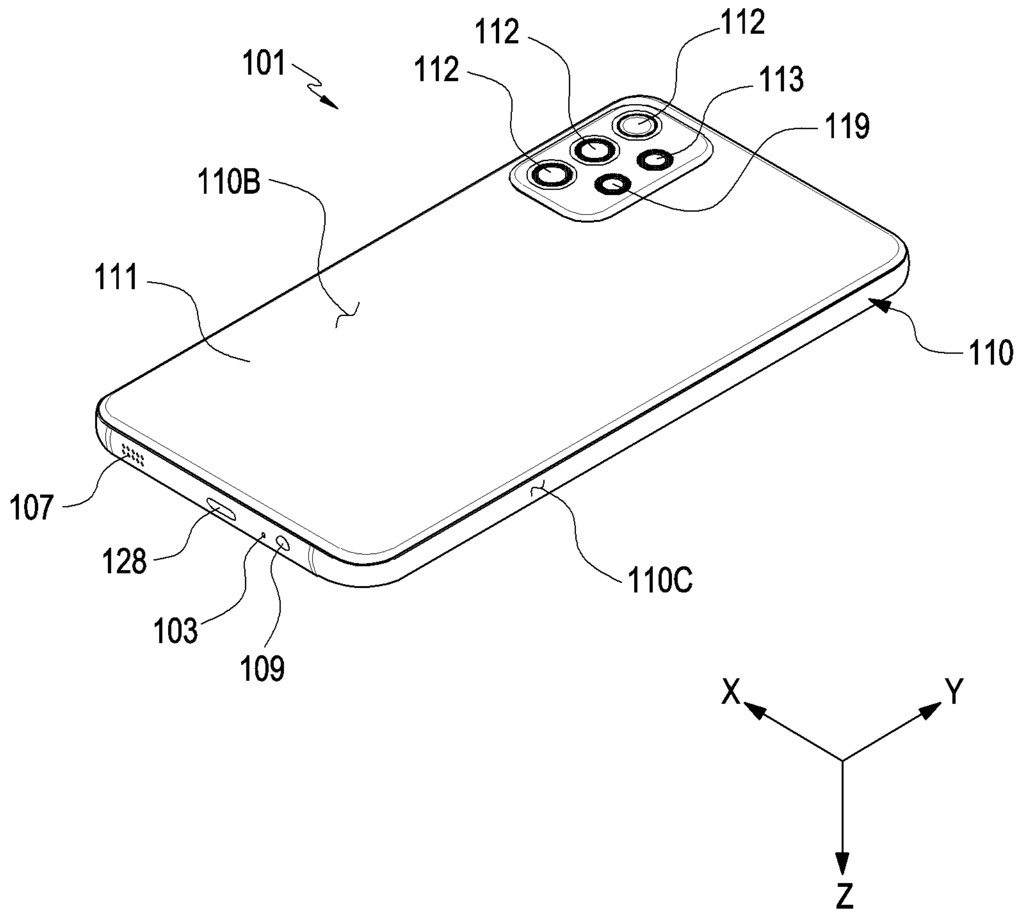
FIG. 3 is a perspective view illustrating a rear surface of the electronic device according to some embodiments of the disclosure.

FIG. 3 is a perspective view illustrating a rear surface of the electronic device 101 illustrated in FIG. 2 according to some embodiments of the disclosure.

Referring to FIGS. 2 and 3, the electronic device 101 (e.g., the electronic device 101 in FIG. 1) according to some embodiments may include a housing 110 which includes a first surface (or front surface) 110A, a second surface (or rear surface) 110B, and side surfaces 110C surrounding a space between the first surface 110A and the second surface 110B. In an embodiment, the housing 110 may refer to a structure that forms a portion of the first surface 110A of FIG. 2, the second surface 110B of FIG. 3, and the side surfaces 110C.

According to some embodiments, at least a portion of the first surface 110A may be formed by a front plate 102 (e.g., a glass plate or polymer plate including various coating layers) at least a portion of which is substantially transparent. The second surface 110B may be formed by a rear plate 111 which is substantially opaque. The rear plate 111 may be formed of, for example, at least one of coated or tinted glass, ceramic, a polymer, or a metal (e.g., aluminum, stainless steel (STS), or magnesium). The side surfaces 110C may be coupled to the front plate 102 and the rear plate 111 and formed by a side structure (or "side bezel structure") 118 including a metal and/or a polymer. In some embodiments, the rear plate 111 and the side structure 118 may be integrally formed and include the same material (e.g., a metallic material such as aluminum).

According to some embodiments, the front plate 102 may include area(s) which are bent and extend seamlessly from at least a portion of an edge of the front plate 102 toward the rear plate 111. For example, the front plate 102 (or the rear plate 111) may include only one of the areas bent and extending toward the rear plate 111 (or the front plate 122) on an edge of one side of the first surface 110A. According to some embodiments, the front plate 122 or the rear plate 111 may have a substantially flat shape, and in this case, may not include any bent extended area. When the front plate 122 or the rear plate 111 includes a bent extended area, the electronic device 101 may have a smaller thickness in a portion including the bent extended area than in any other portion.

According to some embodiments, the electronic device 101 may include at least one of a display 115, an audio module (e.g., a microphone hole 103, an external speaker hole 107, and a receiver hole 114 for calls), a sensor module (e.g., a first sensor module 124, a second sensor module, and a third sensor module 119), a camera module (e.g., a first camera device 105, a second camera device 112, and a flash 113), key input devices 117, a light emitting element 106, or connector holes (e.g., a first connector hole 128 and a second connector hole 109). In some embodiments, the electronic device 101 may not be provided with at least one (e.g., the key input devices 117 or the light emitting element 106) of the components or may additionally include other components.

The display 115 may output a screen or be visually exposed, for example, through a substantial portion of the first surface 110A (e.g., the front plate 102). In some embodiments, at least a portion of the display 115 may be exposed through the front plate 102 forming the first surface 110A or through a portion of a side surface 110C. In some embodiments, a corner of the display 115 may be formed substantially in the same shape as that of an adjacent periphery of the front plate 102. In some embodiments, a gap between the periphery of the display 115 and the periphery of the front plate 102 may be substantially equal to increase the visually exposed area of the display 115.

According to some embodiments, a recess or an opening may be formed in a portion of a screen display area of the display 115, and at least one of the audio module (e.g., the receiver hole 114 for calls), the sensor module (e.g., the first sensor module 124), the camera module (e.g., the first camera device 105), or the light emitting element 106, which is aligned with the recess or the opening, may be included. In an embodiment, at least one of the audio module (e.g., the receiver hole 114 for calls), the sensor module (e.g., the first sensor module 124), the camera module (e.g., the first camera device 105), a fingerprint sensor, or the light emitting element 106 may be included on a rear surface of the screen display area of the display 115. In an embodiment, the display 115 may be incorporated with or disposed adjacent to a touch sensing circuit, a pressure sensor capable of measuring the intensity (pressure) of a touch, and/or a digitizer that detects a magnetic field-based stylus pen.

According to some embodiments, the audio module 103, 107, and 114 may include the microphone hole 103 and the speaker hole (e.g., the external speaker hole 107 and the receiver hole 114 for calls). A microphone for obtaining an external sound may be disposed in the microphone hole 103, and in an embodiment, a plurality of microphones may be disposed to detect the direction of a sound. The speaker hole may include the external speaker hole 107 and the receiver hole 114 for calls. In some embodiments, the speaker hole (e.g., the external speaker hole 107 and the receiver hole 114 for calls) and the microphone hole 103 may be implemented as a single hole, or a speaker (e.g., a piezo speaker) may be included without the speaker hole (e.g., the external speaker hole 107 and the receiver hole 114 for calls).

According to some embodiments, the sensor module may generate an electrical signal or data value corresponding to an internal operating state of the electronic device 101 or an external environmental state. The sensor module may include, for example, the first sensor module 104 (e.g., a proximity sensor) and/or the second sensor module (e.g., a fingerprint sensor) disposed on the first surface 110A, and/or the third sensor module 119 disposed on the second surface 110B of the housing 110. The second sensor module (e.g., a fingerprint sensor) may be disposed on the second surface 110B or a side surface 110C as well as on the first surface 110A (e.g., the display 115) of the housing 110. The electronic device 101 may further include, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 124.

According to some embodiments, the camera module may include the first camera device 105 disposed on the first surface 110A of the electronic device 101, the second camera device 112 disposed on the second surface 110B of the electronic device 101, and/or the flash 113. The camera devices (e.g., the first camera device 105 and the second camera device 112) may include one or more lenses, an image sensor, and/or an ISP. The flash 113 may include, for example, a light emitting diode (LED) or a xenon lamp. In some embodiments, one or more lenses (an IR camera, a wide-angle lens, and a telephoto lens) and image sensors may be arranged on one surface of the electronic device 101. In an embodiment, the flash 113 may irradiate IR light, and the IR light irradiated from the flash 113 and reflected from a subject may be received through the third sensor module 119. The electronic device 101 or the processor (e.g., the processor 120 in FIG. 1) of the electronic device 101 may detect depth information about the subject based on a time when the IR light is received at the third sensor module 119.

According to some embodiments, the key input devices 117 may be arranged on a side surface 110C of the housing 110. In an embodiment, the electronic device 101 may not include some or any of the key input devices 117, and the key input devices 117 which are not included may be implemented in other forms such as soft keys on the display 115. In some embodiments, the key input devices may include a sensor module disposed on the second surface 110B of the housing 110.

According to some embodiments, the light emitting element 106 may be disposed, for example, on the first surface 110A of the housing 110. The light emitting element 106 may provide, for example, state information about the electronic device 101 in the form of light. In some embodiments, the light emitting element 106 may provide, for example, a light source interworking with an operation of the camera module (e.g., the first camera device 105). The light emitting element 106 may include, for example, an LED, an IR LED, and a xenon lamp.

According to some embodiments, the connector holes (e.g., the first connector hole 128 and the second connector hole 109) may include the first connector hole 128 capable of accommodating a connector (e.g., a universal serial bus (USB) connector) for transmitting and receiving power and/or data to and from an external electronic device (e.g., the electronic device 102 in FIG. 1) and/or the second connector hole (e.g., an earphone jack) 109 capable of accommodating a connector for transmitting and receiving an audio signal to and from an external electronic device.

Figure 4A:
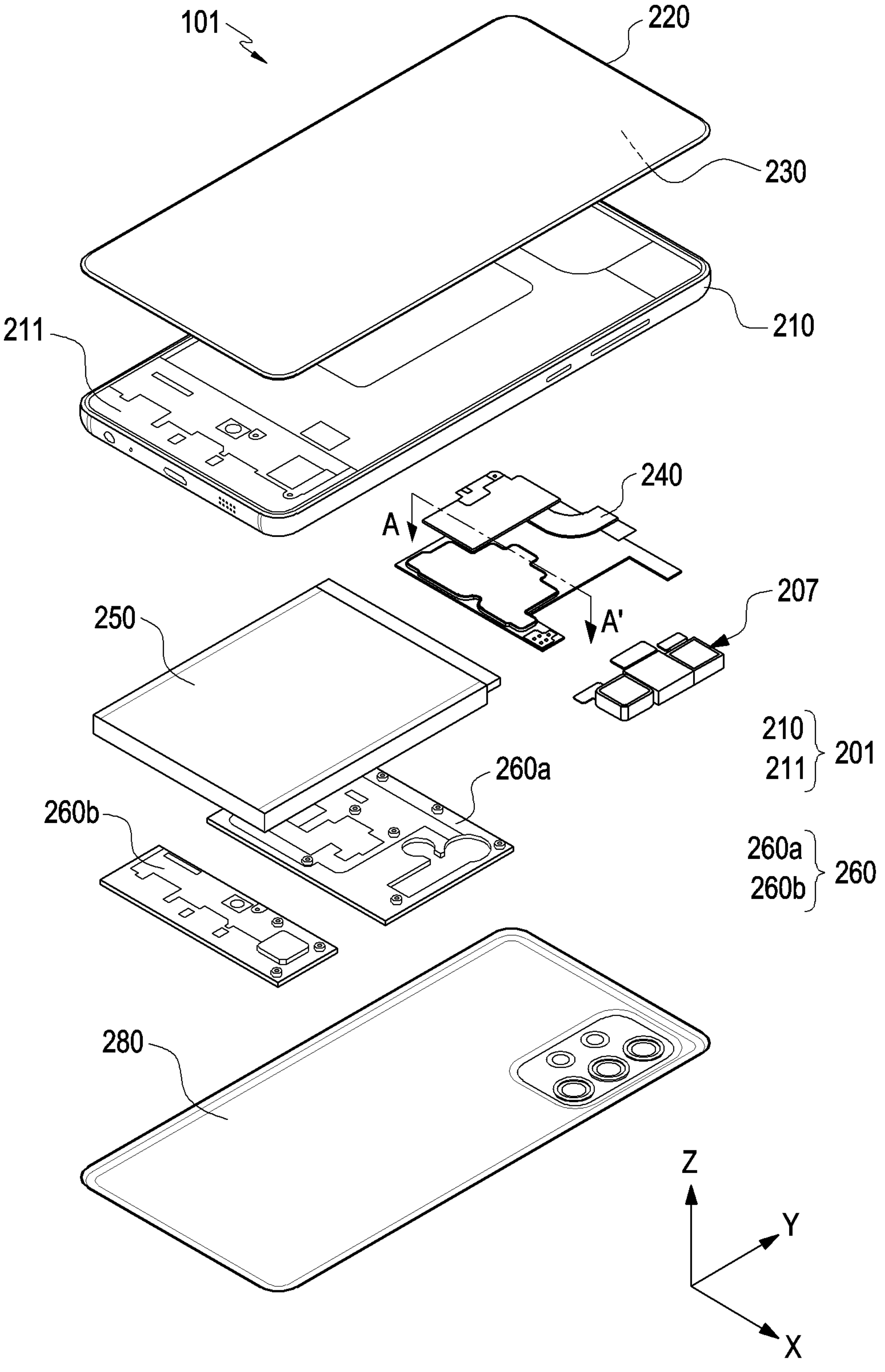
FIG. 4A is an exploded perspective view illustrating the front surface of the electronic device according to some embodiments of the disclosure.

FIG. 4A is an exploded perspective view illustrating the front surface of the electronic device 101 illustrated in FIG. 2 according to some embodiments of the disclosure.

Figure 4B:
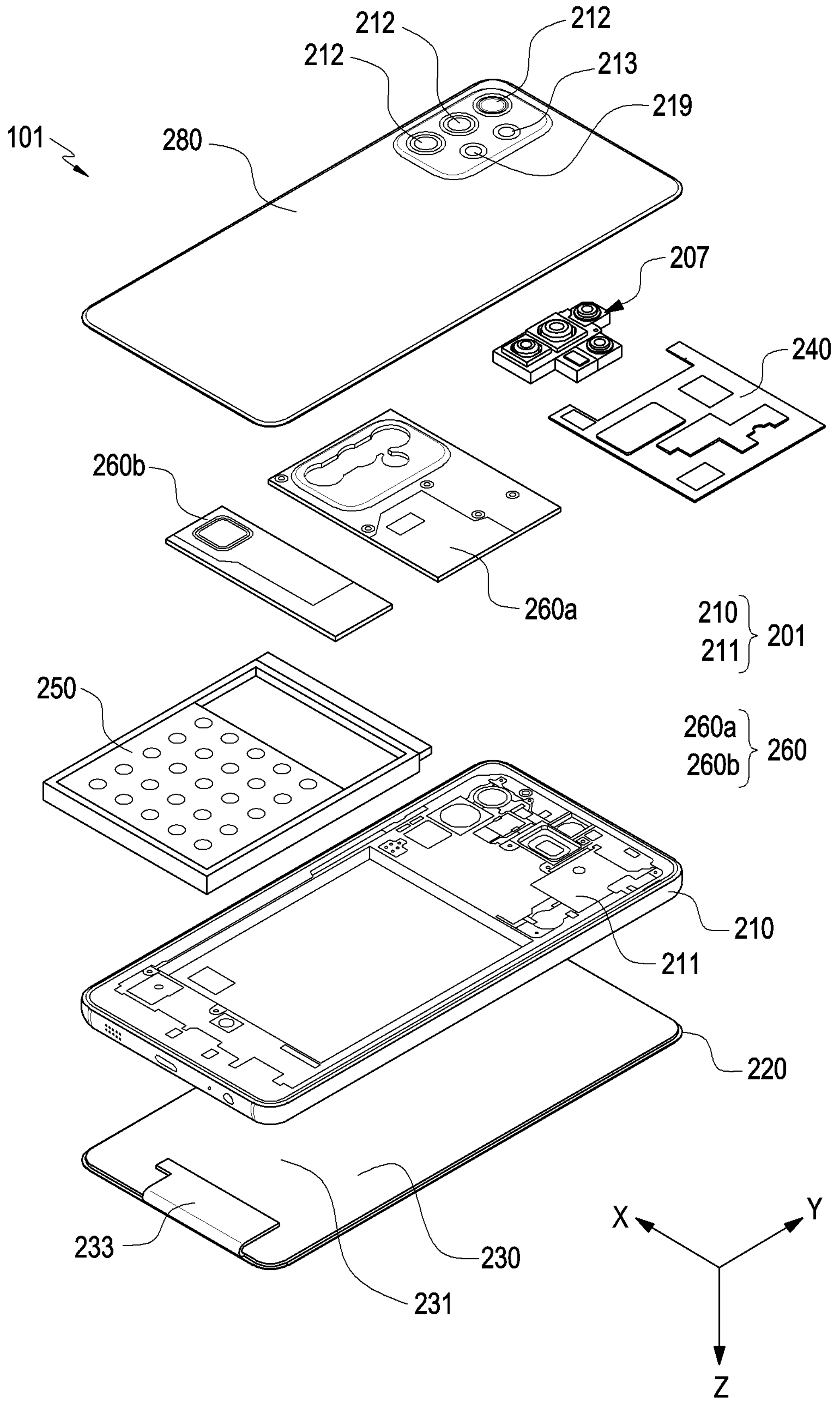
FIG. 4B is an exploded perspective view illustrating the rear surface of the electronic device according to some embodiments of the disclosure.

FIG. 4B is an exploded perspective view illustrating the rear surface of the electronic device 101 illustrated in FIG. 2 according to some embodiments of the disclosure.

Referring to FIGS. 4A and 4B, the electronic device 101 (e.g., the electronic device 101 in FIG. 1, 2, or 3) may include a side structure 210, a first support member 211 (e.g., a bracket), a front plate 220 (e.g., the front plate 122 in FIG. 2), a display 230 (e.g., the display 115 in FIGS. 2 and 3), a PCB (or a board assembly) 240, a battery 250, a second support member 260 (e.g., a rear case), an antenna, a camera assembly 207, and a rear plate 280 (e.g., the rear plate 111 in FIG. 3).

According to some embodiments, the electronic device 101 may not be provided with at least one of the components (e.g., the first support member 211 or the second support member 260) or may additionally include other components. At least one of the components of the electronic device 101 may be the same as or similar to at least one of the components of the electronic device 101 in FIG. 2 or 3, and a redundant description will be avoided.

According to some embodiments, the first support member 211 may be disposed inside the electronic device 101 and connected to the side structure 210, or may be formed integrally with the side structure 210. The first support member 211 may be formed of, for example, a metallic material and/or a non-metallic (e.g., polymer) material. When the first support member 211 is at least partially formed of a metallic material, a portion of the side structure 210 or the first support member 211 may function as an antenna. The first support member 211 may have one surface coupled to the display 230 and the other surface coupled to the PCB 240. A processor (e.g., the processor 120 in FIG. 1), memory (e.g., the memory 130 in FIG. 1), and/or an interface (e.g., the interface 177 in FIG. 1) may be mounted on the PCB 240. The processor may include, for example, at least one of a CPU, an AP, a GPU, an ISP, a sensor hub processor, or a CP.

According to some embodiments, the first support member 211 and the side structure 210 may be combined and referred to as a front case or housing 201. According to some embodiments, the housing 201 may be generally understood as a structure for accommodating, protecting, or disposing the PCB 240 or the battery 250 therein. In some embodiments, the housing 201 may be understood as including a structure visually or tactilely recognizable to a user from the outside of the electronic device 101, such as, the side structure 210, the front plate 220, and/or the rear plate 280. In some embodiments, 'a front or rear surface of the housing 201' may be interpreted as the first surface 110A of FIG. 2 or the second surface 110B of FIG. 3. In some embodiments, the first support member 211 may be disposed between the front plate 220 (e.g., the first surface 110A in FIG. 2) and the rear plate 280 (e.g., the second surface 110B in FIG. 3), and function as a structure for disposing electrical/electronic components such as the PCB 240 or the camera assembly 207 thereon.

According to some embodiments, the display 230 may include a display panel 231 and a flexible PCB (FPCB) 233 extending from the display panel 231. For example, the FPCB 233 may be understood as being at least partially disposed on a rear surface of the display panel 231 and electrically connected to the display panel 231. In some embodiments, reference number '231' may be understood as indicating a protection sheet disposed on the rear surface of the display panel. For example, unless otherwise specified in the following description, the protection sheet may be understood as a portion of the display panel 231. In some embodiments, the protection sheet may function as a buffering structure (e.g., a low-density elastomer such as a sponge) or an electromagnetic shielding structure (e.g., a copper (CU) sheet), which absorbs an external force. According to some embodiments, the display 230 may be disposed on an inner surface of the front plate 220 and include a light emitting layer to display a screen through at least a portion of the first surface 110A of FIG. 2 or the front plate 220. As mentioned before, the display 230 may output a screen substantially through the entire area of the first surface 110A of FIG. 2 or the front plate 220.

According to some embodiments, the memory may include, for example, volatile memory or non-volatile memory.

According to some embodiments, the interface may include, for example, a high definition multimedia interface (HDMI), a USB interface, a secure digital (SD) card interface, and/or an audio interface. For example, the interface may electrically or physically connect the electronic device 101 to an external electronic device, and include a USB connector, an SD card/MMC connector, or an audio connector.

According to some embodiments, the second support member 260 may include, for example, an upper support member 260*a* and a lower support member 260*b*. In some embodiments, the upper support member 260*a* may be disposed to surround the PCB 240 together with a portion of the first support member 211. Circuit devices (e.g., a processor, a communication module, or memory) implemented in the form of integrated circuit chips or various electrical/electronic components may be disposed on the PCB 240. According to some embodiments, an electromagnetic shielding environment may be provided to the PCB 240 by the upper support member 260*a*. In some embodiments, the lower support member 260*b* may be used as a structure for disposing electrical/electronic components such as a speaker module and an interface (e.g., a USB connector, an SD card/MMC connector, or an audio connector) thereon. In some embodiments, the electrical/electronic components such as a speaker module and an interface (e.g., a USB connector, an SD card/MMC connector, or an audio connector) may be disposed on an additional PCB which is not shown. In this case, the lower support member 260*b* may be disposed to surround the additional PCB together with another portion of the first support member 211. The speaker module or the interface disposed on the additional PCB or the lower support member 260*b* may be disposed to correspond to the audio module (e.g., the microphone hole 103 or the speaker hole (e.g., the external speaker hole 107 and the receiver hole 114 for calls)) or the connector holes (e.g., the first connector hole 128 and the second connector hole 109) of FIG. 2.

According to some embodiments, the battery 250, which is a device for supplying power to at least one component of the electronic device 101, may include, for example, a non-rechargeable primary battery, a rechargeable secondary battery, or a fuel cell. At least a portion of the battery 250 may be disposed, for example, on substantially the same plane as the PCB 240. The battery 250 may be disposed integrally within the electronic device 101, or detachably from the electronic device 101.

The antenna may include a conductor pattern implemented on a surface of the second support member 260 through, for example, laser direct structuring. In some embodiments, the antenna may include a printed circuit pattern formed on a surface of a thin film, and the antenna in the form of a thin film may be disposed between the rear plate 280 and the battery 250. The antenna may include, for example, a near field communication (NFC) antenna, a wireless charging antenna, and/or a magnetic secure transmission (MST) antenna. For example, the antenna may perform short-range communication with an external device or wirelessly transmit and receive power required for charging to and from an external device. In some embodiments, another antenna structure may be formed by a portion or combination of the side structure 210 and/or the first support member 211.

According to some embodiments, the camera assembly 207 may include at least one camera module. Inside the electronic device 101, the camera assembly 207 may receive at least a portion of light incident through an optical hole or camera windows 212, 213, and 219. In some embodiments, the camera assembly 207 may be disposed on the first support member 211 at a position adjacent to the PCB 240. In some embodiments, the camera module(s) of the camera assembly 207 may be generally aligned with any one of the camera windows 212, 213, and 219 and at least partially surrounded by the second support member 260 (e.g., the upper support member 260*a*).

Figure 5:
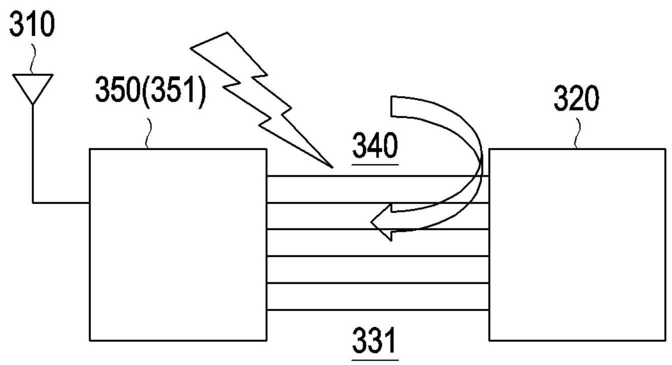
FIG. 5 is a schematic diagram illustrating a process in which radio frequency noise is generated in a first module according to some embodiments of the disclosure.
Figure 6:
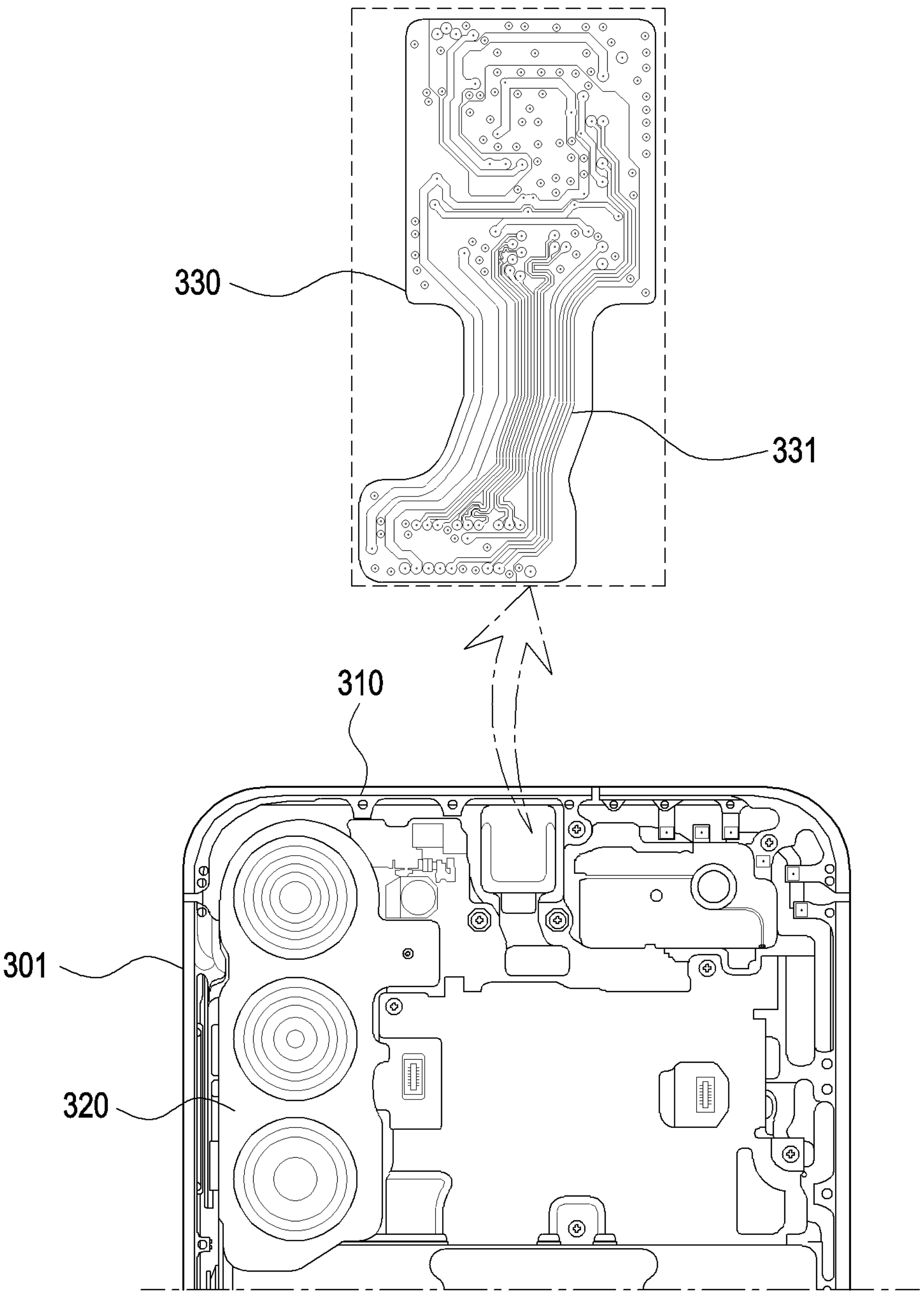
FIG. 6 is a diagram illustrating an arrangement relationship between a conductive portion and a first module according to some embodiments of the disclosure.

FIG. 5 is a schematic diagram illustrating a process in which radio frequency (RF) noise is generated in a first module 320 according to some embodiments of the disclosure. FIG. 6 is a diagram illustrating an arrangement relationship between a conductive portion 310 and the first module 320 according to some embodiments.

Referring to FIGS. 5 and 6, the electronic device 101 may include a housing 301, a first PCB 330, the first module 320, and a communication wire 340. The configuration of the first PCB 330 in FIGS. 5 and 6 may be wholly or partially the same as that of the PCB 240 in FIGS. 2 to 4B. The structures of FIGS. 5 and 6 may be selectively combined with the structures of FIGS. 2 to 4B.

According to some embodiments, the electronic device 101 may further include an antenna structure, and the antenna structure may include a plurality of antennas. For example, the antenna may include the conductive portion 310, a feeding portion, or a ground portion. According to some embodiments, at least one component (e.g., the conductive portion 310) of the antenna structure may be located in one area of the housing 301. The electronic device 101 may further include various components (e.g., a PCB, a camera module, and a battery) disposed within the housing 301.

According to some embodiments, at least a portion of the housing 301 may be formed of a metallic material in order to improve the aesthetics of the electronic device 101 and reduce the thickness of the electronic device 101 in a folded state. According to some embodiments, the housing 301 may include at least one conductive portion 310 segmented along at least a portion of a side surface of the housing 301. For example, the conductive portion 310 may be a frame of the housing 301, made of a metallic material, and may be used as a radiator of the antenna. In some embodiments, one end of the conductive portion 310 may be segmented to be used as the radiator of the antenna. However, the segment portion may be subjected to various design modifications depending on a used frequency range of the antenna. According to some embodiments, a rear surface of the housing 301 may include a material that does not interfere with antenna radiation. For example, the rear surface of the housing 301 may include glass or an injection molded material.

According to some embodiments, the antenna including the conductive portion 310 may be formed to receive a signal of a first frequency. When the signal of the first frequency of the antenna including the conductive portion 310 overlaps with a resonant frequency of the communication wire connected to the adjacent first module 320, RF noise may be generated. When RF noise is introduced into the wire of the first module 320, the H-Field of the introduced RF noise may affect an adjacent mobile industry processor interface (MIPI) wire 331, causing a malfunction of the first module 320. The MIPI wire, which is a high-speed communication wire, may be very vulnerable to noise.

According to some embodiments, the first module 320 may be located within the housing 301 and disposed adjacent to the conductive portion 310. For example, the first module 320 may include a camera module or sensor module disposed adjacent to the conductive portion 310.

According to some embodiments, a PCB (e.g., the PCB 240 in FIG. 4A) may be located within the housing 301, and include the first PCB 330 and/or a second PCB 350 electrically connected to the first PCB 330. According to some embodiments, a second module 351 (e.g., an AP) may be disposed on the second PCB 350. According to an embodiment, the first PCB 330 may be electrically connected to the first module 320. For example, the second PCB 350 may be a main PCB. For example, the first PCB 330 may be a PCB that electrically connects the second PCB 350 to the first module 320.

According to some embodiments, a processor (e.g., the processor 120 in FIG. 1), memory (e.g., the memory 130 in FIG. 1), a communication module (e.g., the communication wire 340) (e.g., the communication module 190 in FIG. 1), and/or an interface (e.g., the interface 177 in FIG. 1) may be mounted on the PCB (e.g., the PCB 240 in FIG. 4A) (e.g., the first PCB 330 and/or the second PCB 350). The processor may include, for example, at least one of a CPU, an AP, a GPU, an ISP, a sensor hub processor, or a CP. The memory may include volatile memory or non-volatile memory. The interface may include, for example, a HDMI, a USB interface, an SD card interface, and/or an audio interface. For example, the interface may connect the electronic device 101 to an external electronic device electrically or physically, and include a USB connector, an SD card/MMC connector, or an audio connector.

Figure 7:
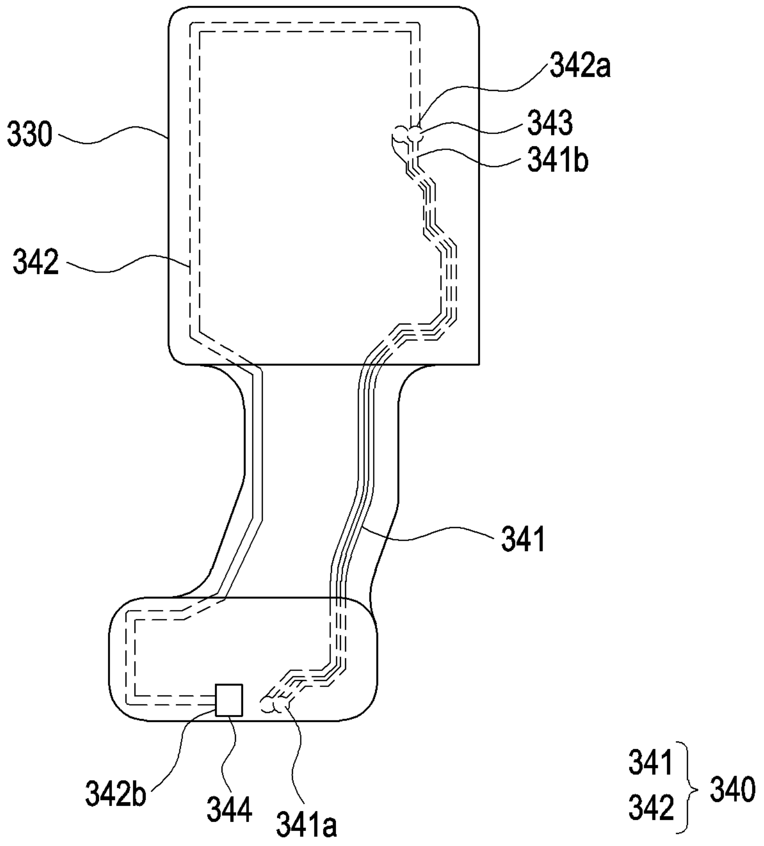
FIG. 7 is a diagram illustrating a first communication line and a second communication line according to some embodiments of the disclosure.

FIG. 7 is a diagram illustrating a first communication wire 341 and a second communication wire 342 according to some embodiments of the disclosure.

Referring to FIG. 7, the electronic device 101 may include the housing 301, the first PCB 330, the second PCB 350, the first module 320, and the communication wire 340. The configurations of the PCBs 330 and 350 in FIG. 7 may be wholly or partially the same as the configuration of the PCB 240 in FIGS. 2 to 4B. The structures of FIG. 7 may be selectively combined with the structures of FIGS. 2 to 4B.

According to some embodiments, the first PCB 330 may include the communication wire 340. For example, the communication wire 340 may be connected to the processor on the second PCB 350 electrically connected to the first PCB 330. For example, the communication wire 340 may be a wire for communication between the processor and the first module 320. According to some embodiments, the communication wire 340 may include the first communication wire 341 disposed on the first PCB 330, and the second communication wire 342 electrically connected to the first communication wire 341.

According to some embodiments, the first communication wire 341 may be a low-speed communication wire. According to some embodiments, the first communication wire 341 may be an inter integrated circuit (I2C) communication wire. For example, I2C communication may be a low-speed communication interface that may connect multiple devices to each other with two wires. The I2C communication is simpler than other communication interfaces and connects one first device (e.g., a master) and multiple second devices (e.g., slaves) to transmit and receive data through two signals, serial data (SDA) and serial clock (SCL). The I2C communication may be defined as a two wire interface (TWI) that allows communication by connecting two wires. In I2C communication, a neighboring device that wants to communicate with a first device (e.g., a primary device) may be set as a second device (e.g., a secondary device). For example, communication may be possible between one first device (e.g., a primary device) and multiple second devices (e.g., secondary devices). For example, two or more first devices (e.g., primary devices) may be available.

According to some embodiments, the first communication line 341 and the second communication line 342 may be connected to each other in parallel. According to some embodiments, the first communication line 341 and the second communication line 342 may be connected through a stub 343. According to some embodiments, the first communication line 341 and the second communication line 342 may be disposed in a loop shape along an edge area of the first PCB 330. For example, because impedance is not very important due to low-speed communication, the first communication line 341 and the second communication line 342 may be implemented in a minimum line width possible and as a loop type.

According to some embodiments, as the second communication line 342 of a second length L2 is connected to the first communication line 341 of a first length L1 in parallel, the total length of the communication line 340 may be a third length L3, which is the sum of the two lengths (L1+L2=L3).

According to some embodiments, when the length of the communication line 340 is the third length L3, a resonant frequency of the communication line 340 may be a second frequency different from the first frequency. According to some embodiments, the second frequency may not overlap with a band in which the electronic device 101 communicates with a base station. According to some embodiments, the second frequency may be set based on a band in which the electronic device 101 does not communicate with the base station. According to some embodiments, because the length (wavelength) of the communication line 340 is inversely proportional to the frequency, the frequency band may be lowered by increasing the length of the communication line 340. The length (wavelength) of the communication line can be calculated using the equation described by Equation 1.

$$\lambda = \frac{c}{f * \sqrt{\varepsilon}} \quad \text{[Equation 1]}$$

λ represents the length (wavelength) of the communication line 340, c represents the speed of light, f represents frequency, and ε represents the PCB dielectric constant.

For example, when the first communication line 341 and the second communication line 342 are connected to each other in parallel, and thus the total length of the communication line 340 is the third length L3, the resonant frequency may be lowered, compared to the case where only the first communication line 341 of the first length L1 is disposed. According to some embodiments, a design may be made such that the resonant frequency is lowered by changing the length of the communication line 340, to avoid the frequency of the conductive portion 310. Therefore, because resonance does not overlap with a frequency used by the antenna including the adjacent conductive portion 310, wireless communication noise (RF noise) may be reduced.

According to some embodiments, the stub 343 may be at least one of an open stub or a short stub. For example, the stub 343 may have either an open end or a short end. When a short stub is used, length adjustment is impossible, and thus it may be used when the length and frequency of the communication line 340 are limited. When an open stub is used, the absence of a ground (GND) via facilitates length adjustment. Accordingly, when length adjustment is needed, the open stub may be used. According to some embodiments, the resonant frequency may be shifted by connecting a switch to the end of the stub 343 and selectively using a capacitor or an inductor.

According to some embodiments, a first end 341*a* of the first communication line 341 may be connected to the second module 351, and a second end 341*b* of the first communication line 341 may be connected to the stub 343. According to some embodiments, a third end 342*a* of the second communication line 342 may be connected to the stub 343. In some embodiments, a fourth end 342*b* of the second communication line 342 may be connected to a switch 344. The second communication line 342 may be configured to switch to a first state in which the fourth end 342*b* is open through the switch 344 or to a second (short) state in which the fourth end 342*b* is electrically connected to a ground through the switch 344. The second communication line 342 may have its length adjusted and its resonant frequency shifted through on/off of the switch 344. According to some embodiments, the second communication line 342 may not be connected to the switch 344. According to some embodiments, the fourth end 342*b* of the second communication line 342 may be electrically connected to the ground. According to some embodiments, the fourth end 342*b* of the second communication line 342 may be in an open state.

Figure 8A:
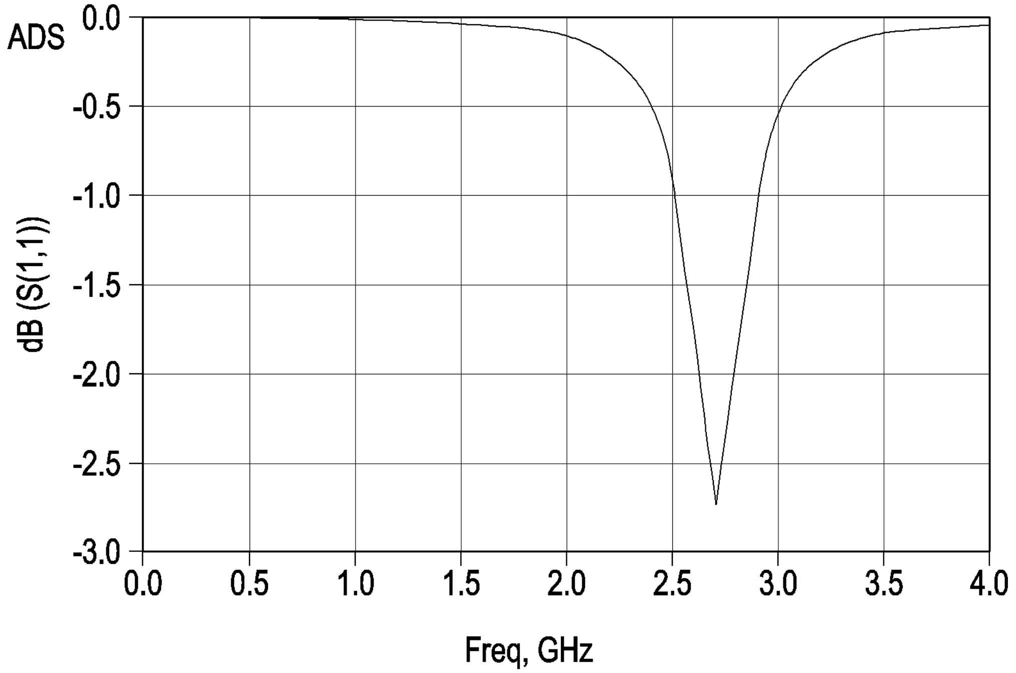
FIG. 8A is a diagram illustrating S-parameter simulation results for an electronic device including only a first communication line according to some embodiments of the disclosure.
Figure 8B:
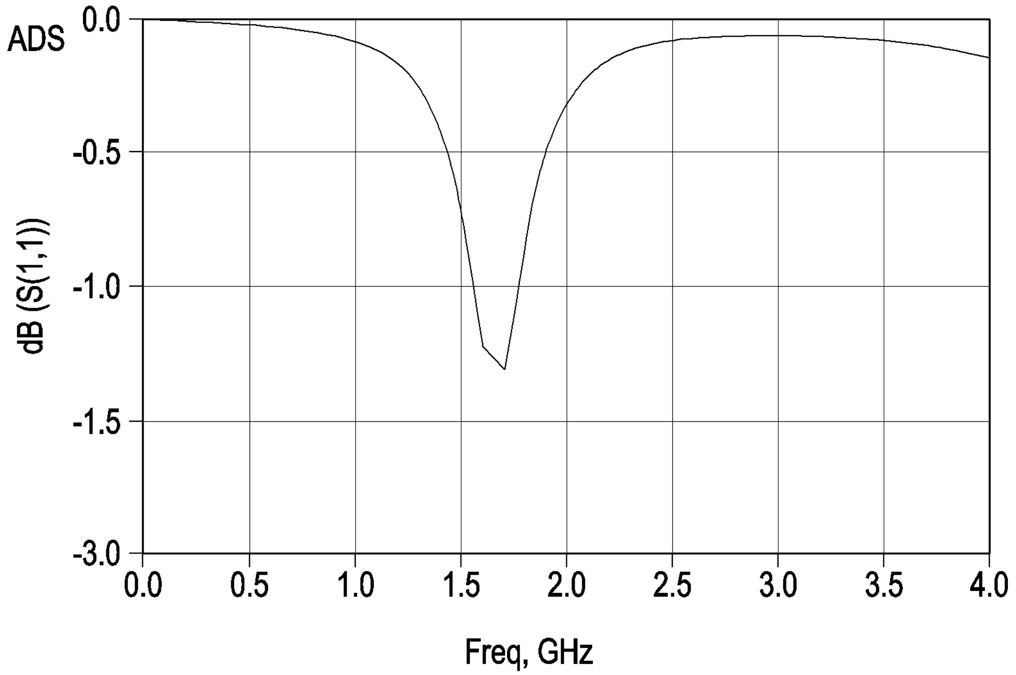
FIG. 8B is a diagram illustrating S-parameter simulation results for an electronic device including a first communication line and a second communication line according some embodiments of the disclosure.

FIG. 8A is a diagram illustrating S-parameter simulation results for an electronic device 101 including only the first communication line 341 according to some embodiments of the disclosure. FIG. 8B is a diagram illustrating S-parameter simulation results for the electronic device 101 including the first communication line 341 and the second communication line 342 according to some embodiments of the disclosure.

Referring to FIGS. 8A and 8B, the electronic device 101 may include the housing 301, the first PCB 330, the first module 320, and the communication line 340. The configurations of the PCBs 330 and 350 in FIGS. 8A and 8B may be wholly or partially the same as those of the first PCB 330 and the first PCB 240 in FIGS. 2 to 4B. The structures of FIGS. 8A and 8B may be selectively combined with the structures of FIGS. 2 to 4B.

According to some embodiments, when the first frequency is in an N41 band (2.5 GHz to 2.7 GHz), the second frequency may be 700 MHz or less, or 1.0 GHz or more and 1.8 GHz or less. For example, the second frequency may be 500 MHz or less. For example, the second frequency may be 1.1 GHz or more and 1.6 GHz or less.

FIGS. 8A and 8B are based on the assumption that the first frequency of the antenna including the conductive portion 310 is in the N41 band (2.5 GHz to 2.7 GHz). Referring to FIG. 8A, it may be noted that the second frequency of the communication line 340 including only the first communication line 341 resonates in the N41 band (2.5 GHz to 2.7 GHz). Referring to FIG. 8B, it may be identified that when the first communication line 341 and the second communication line 342 are configured as a loop type along the edge area of the first PCB 330, the resonance of the second frequency is shifted to a 1.6 GHz band. Therefore, a resonant frequency may be formed in a designer-intended band by adjusting the length of the communication line 340 used in the first module 320 such that the resonant frequency does not overlap with a frequency band used in the conductive portion 310 adjacent to the first module 320.

When RF noise is introduced into a module such as a camera or a sensor, which is adjacent to an antenna, the module may malfunction. Recently, as a band used in an antenna close to a camera overlaps with the resonant frequency of an I2C line among camera lines, radiated RF noise is introduced, and the H-Field of the introduced RF current noise affects an adjacent MIPI line, thereby resulting in malfunction of the camera.

The electronic device according to some embodiments of the disclosure may avoid overlap between a band used in an antenna and the resonant frequency of an I2C line among camera lines by increasing the length of the communication line 340 such as an I2C line performing communication at several MHz or less, in a loop form, in order to reduce malfunction caused by RF noise introduced into a camera or sensor adjacent to the antenna.

The effects obtainable from the disclosure are not limited to the effects mentioned above, and other effects not mentioned may be clearly understood by those skilled in the art from the following description.

An electronic device according to some embodiments of the disclosure may include a housing (e.g., the housing 301 in FIG. 6) including at least one conductive portion (e.g., the conductive portion 310 in FIG. 6) segmented along at least a portion of a side surface of the housing, a first module (e.g., the first module 320 in FIG. 6) inside the housing and adjacent to the conductive portion, a first PCB (e.g., the first PCB 330 in FIG. 6) inside the housing and electrically connected to the first module, and a communication line including a first communication line (e.g., the first communication line 341 in FIG. 7) on an edge of the first printed circuit board and connected to the first module, and a second communication line (e.g., the second communication line 342 in FIG. 7) electrically connected to the first communication line.

According to some embodiments, the at least one conductive portion may be configured to receive a signal of a first frequency, and the communication line may be configured to resonate at a second frequency different from the first frequency.

According to some embodiments, the first communication line and the second communication line may be connected to each other in parallel.

According to some embodiments, the first communication line and the second communication line may be disposed in a loop shape through a stub (e.g., the stub 343 in FIG. 7).

According to some embodiments, the electronic device may further include a second PCB electrically connected to the first PCB, and the communication line on the first PCB may be electrically connected to at least one processor on the second PCB.

According to some embodiments, a first end of the second communication line may be connected to the first communication line through the stub, and a second end of the second communication line, different from the first end, may be connected to a switch.

According to some embodiments, the second communication line may be configured to be switchable, via the switch, to a first state in which the second end is open or to a second state in which the second end is electrically connected to a ground.

According to some embodiments, the first communication line may be a low-speed communication line.

According to some embodiments, the second frequency may be 700 MHz or less, or 1.0 GHz or more and 1.8 GHz or less.

According to some embodiments, the first module may be a camera disposed adjacent to the at least one conductive portion.

According to some embodiments, the first module may be a sensor module disposed adjacent to the at least one conductive portion.

According to some embodiments, the at least one conductive portion may be formed to operate as an antenna radiator.

According to some embodiments, as the first communication line of a first length and the second communication line of a second length are connected to each other in parallel, a total length of the communication line may be a sum of the first length and the second length.

An electronic device according to some embodiments of the disclosure may include the housing 301 including at least one conductive portion 310 segmented along at least a portion of a side surface of the housing, the first module 320 inside the housing and adjacent to the at least one conductive portion, the first PCB 330 inside the housing and electrically connected to the first module, and the communication line 340 including the first communication line 341 on an edge of the first printed circuit board and connected to the first module, and the second communication line 342 connected in parallel with the first communication line. The conductive portion may be configured to receive a signal of a first frequency, and the communication line may be configured to resonate at a second frequency different from the first frequency.

According to some embodiments, the first communication line and the second communication line may be in a loop shape through the stub 343.

According to some embodiments, the electronic device may further includes a second PCB electrically connected to the first printed circuit board, and the communication line on the first PCB may be electrically connected to at least one processor on the second PCB.

According some embodiments, a first end of the second communication line may be connected to the first communication line through the stub, and a second end of the second communication line, different from the first, end may be connected to a switch.

According to some embodiments, the second communication line may be configured to be switchable, via the switch, to a first state in which the second end is open or to a second state in which the second end is electrically connected to a ground.

According to some embodiments, the first communication line may be a low-speed communication line.

According to some embodiments, the second frequency may be 700 MHz or less, or 1.0 GHz or more and 1.8 GHz or less.

While certain example embodiments the disclosure have been particularly shown and described, it will be understood that various changes in form and details may be made therein without departing from the spirit and scope of the following claims.

What is claimed is:

1. An electronic device comprising:

a housing comprising at least one conductive portion disposed along at least a portion of a side surface of the housing, the at least one conductive portion being configured to operate as an antenna radiator to receive or transmit a signal;

a first module disposed in the housing and adjacent to the at least one conductive portion;

a first printed circuit board on which the first module is disposed and connected to the first module;

a communication line disposed on the first printed circuit board; and a second printed circuit board disposed in the housing, wherein the communication line comprises a first communication line extending in a first direction along an edge of the first printed circuit board electrically connecting the first module to the second printed circuit board and a second communication line extending in a second direction different from the first direction along the edge of the first printed circuit board, wherein a first end of the second communication line is connected to an end of the first communication line, and wherein a second end of the second communication line, different from the first end, is open or shorted to have a frequency different from a frequency of the signal received or transmitted by the at least one conductive portion.

2. The electronic device of claim 1, wherein the first communication line is disposed along the edge of the first printed circuit board; and the second communication line is electrically connected to the first communication line via a stub.

3. The electronic device of claim 1, wherein the first communication line and the second communication line form a loop shape.

4. The electronic device of claim 1, further comprising at least one processor disposed on the second printed circuit board and electrically connected to the first module.

5. The electronic device of claim 1, wherein the second end of the second communication line is connected to a switch and the second communication line is configured to be switchable, via the switch, to a first state in which the second end is open or to a second state in which the second end is electrically connected to a ground.

6. The electronic device of claim 1, wherein the first communication line is a low-speed communication line.

7. The electronic device of claim 1, wherein the frequency of the communication line is 700 MHz or less, or 1.0 GHz or more and 1.8 GHz or less.

8. The electronic device of claim 1, wherein the first module is a camera adjacent to the at least one conductive portion.

9. The electronic device of claim 1, wherein the first module is a sensor adjacent to the at least one conductive portion.

10. The electronic device of claim 1, wherein as the first communication line having a first length and the second communication line having a second length are connected in parallel, a total length of the communication line is a sum of the first length and the second length.

11. The electronic device of claim 1, wherein the first communication line is connected to the first module through a stub.

12. The electronic device of claim 2, wherein the stub is an open stub or a short stub.

13. The electronic device of claim 6, wherein the first communication line is an I2C (inter integrated circuit) communication line.

* * * * *